US009021984B2

(12) United States Patent
Yamamoto et al.

(10) Patent No.: US 9,021,984 B2
(45) Date of Patent: May 5, 2015

(54) PLASMA PROCESSING APPARATUS AND SEMICONDUCTOR DEVICE MANUFACTURING METHOD

(75) Inventors: Takashi Yamamoto, Nirasaki (JP); Shunsuke Mizukami, Nirasaki (JP); Ryuji Ohtani, Nirasaki (JP); Kimlhiro Higuchi, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 1071 days.

(21) Appl. No.: 13/075,634

(22) Filed: Mar. 30, 2011

(65) Prior Publication Data
US 2011/0240221 A1 Oct. 6, 2011

Related U.S. Application Data

(60) Provisional application No. 61/323,059, filed on Apr. 12, 2010.

(30) Foreign Application Priority Data

Mar. 30, 2010 (JP) .................................. 2010-077282

(51) Int. Cl.
| | |
|---|---|
| *C23C 16/507* | (2006.01) |
| *C23C 16/509* | (2006.01) |
| *H01L 21/306* | (2006.01) |
| *C23F 1/00* | (2006.01) |
| *H01L 21/683* | (2006.01) |
| *H01J 37/32* | (2006.01) |
| *C23C 16/06* | (2006.01) |
| *C23C 16/22* | (2006.01) |
| *H01L 21/67* | (2006.01) |

(52) U.S. Cl.
CPC .......... *H01L 21/6831* (2013.01); *C23C 16/507* (2013.01); *C23C 16/509* (2013.01); *C23C 16/5093* (2013.01); *H01J 37/32091* (2013.01); *H01J 37/32165* (2013.01); *H01J 37/32642* (2013.01); *H01L 21/67103* (2013.01); *H01L 21/67109* (2013.01)

(58) Field of Classification Search
CPC .. C23C 16/507; C23C 16/509; C23C 16/5093
USPC ......... 118/723 R, 723 E; 156/345.43, 345.44, 156/345.45, 345.46, 345.47
See application file for complete search history.

(56) References Cited

U.S. PATENT DOCUMENTS

| | | | |
|---|---|---|---|
| 2003/0164226 A1 | 9/2003 | Kanno et al. | |
| 2004/0177927 A1* | 9/2004 | Kikuchi et al. | .......... 156/345.51 |

FOREIGN PATENT DOCUMENTS

| | | | |
|---|---|---|---|
| CN | 1591793 A | | 3/2005 |
| JP | 58016506 A | * | 1/1983 |
| JP | 2003-309110 A | | 10/2003 |
| JP | 2004-235623 A | | 8/2004 |
| JP | 2008-306212 | | 12/2008 |
| JP | 2010-16319 A | | 1/2010 |
| TW | 483037 B | | 4/2002 |

* cited by examiner

*Primary Examiner* — Rudy Zervigon
(74) *Attorney, Agent, or Firm* — Rothwell, Figg, Ernst & Manbeck, P.C.

(57) ABSTRACT

A plasma processing apparatus includes a processing chamber; a lower electrode provided in the processing chamber and having a base made of a conductive metal to which a high frequency power is applied, the lower electrode also serving as a mounting table for mounting thereon a target substrate; an upper electrode provided in the processing chamber to face the lower electrode; and a focus ring disposed above the lower electrode to surround the target substrate. An electrical connection mechanism is provided between the base of the lower electrode and the focus ring to electrically connect the base of the lower electrode to the focus ring through a current control element, and generates a DC current in accordance with a potential difference.

5 Claims, 5 Drawing Sheets

PLASMA PROCESSING APPARATUS AND SEMICONDUCTOR DEVICE MANUFACTURING METHOD

CROSS-REFERENCE TO RELATED APPLICATION

This application claims priority to Japanese Patent Application No. 2010-077282 filed on Mar. 30, 2010 and U.S. Provisional Application No. 61/323,059 filed on Apr. 12, 2010, the entire contents of which are incorporated herein by reference.

FIELD OF THE INVENTION

The present invention relates to a plasma processing apparatus and a semiconductor device manufacturing method.

BACKGROUND OF THE INVENTION

Conventionally, a plasma processing apparatus for performing various processes, e.g., etching, film formation and the like, on a substrate (e.g., a semiconductor wafer) provided in a processing chamber by using a plasma has been used in a semiconductor device manufacturing process.

As for the plasma processing apparatus, there is known, e.g., a capacitively coupled plasma processing apparatus for generating a plasma by applying a high frequency power between a lower electrode also serving as a mounting table (susceptor) for mounting thereon a semiconductor wafer and an upper electrode disposed to face the lower electrode. Further, in this plasma processing apparatus, it is known that an electrostatic chuck for electrostatically attracting a semiconductor wafer is provided at the lower electrode and an annular focus ring is disposed to surround the semiconductor wafer, thereby improving processing uniformity (see, e.g., Japanese Patent Application Publication No. 2008-306212).

In this plasma processing apparatus, a bias voltage of about −2000 V at maximum is generated at the focus ring and the semiconductor wafer exposed to the plasma. Meanwhile, a plus voltage of about 2000 V to 2500 V is applied to the electrode of the electrostatic chuck, so that polarization charges are generated between the electrode of the electrostatic chuck and the base of the lower electrode which is made of a conductive metal. In this case, a polarization potential is divided by a high frequency application circuit connected to the base of the lower electrode and becomes about 2000 V at maximum while it is determined by a high frequency application circuit constant and a chamber circuit constant.

Therefore, a potential difference of about 4000 V at maximum is generated between the semiconductor wafer and the lower electrode. This leads to discharge (arc) between the semiconductor wafer and the base of the lower electrode or its surrounding structure, so that semiconductor chips formed on the semiconductor wafer may be damaged. When the semiconductor chips formed on the semiconductor wafer are damaged, a production yield is decreased and, also, productivity is decreased.

The discharge can be prevented by increasing a withstand voltage between the semiconductor wafer and the base of the lower electrode or the like to, e.g., about 5000 V. However, it is not easy to increase the withstand voltage because the lower electrode is provided with, e.g., openings for lift pins for lifting the semiconductor wafer, gas supply openings for supplying He gas for transferring heat between the backside of the semiconductor wafer and the surface of the electrostatic chuck and the like.

SUMMARY OF THE INVENTION

In view of the above, the present invention provides a plasma processing apparatus capable of preventing discharge between a substrate such as a semiconductor wafer or the like and a base of a lower electrode or its surrounding structure to thereby increase a production yield and improve productivity, and a semiconductor device manufacturing method.

In accordance with an aspect of the present invention, there is provided a plasma processing apparatus including: a processing chamber; a lower electrode provided in the processing chamber and having a base made of a conductive metal to which a high frequency power is applied, the lower electrode also serving as a mounting table for mounting thereon a target substrate; an upper electrode provided in the processing chamber to face the lower electrode; and a focus ring disposed above the lower electrode to surround the target substrate, wherein an electrical connection mechanism is provided between the base of the lower electrode and the focus ring to electrically connect the base of the lower electrode to the focus ring through a current control element, and generates a DC current in accordance with a potential difference.

In accordance with another aspect of the present invention, there is provided a semiconductor device manufacturing method for manufacturing a semiconductor device and plasma-processing a target substrate by using a plasma processing apparatus. The plasma processing apparatus includes: a processing chamber; a lower electrode provided in the processing chamber and having a base made of a conductive metal to which a high frequency power is applied, the lower electrode also serving as a mounting table for mounting thereon a target substrate; an upper electrode provided in the processing chamber to face the lower electrode; and a focus ring disposed above the lower electrode to surround a periphery of the target substrate.

The semiconductor device manufacturing method includes: providing an electrical connection mechanism between the base of the lower electrode and the focus ring to electrically connect the base of the lower electrode to the focus ring through a current control element and generate a DC current in accordance with a potential difference; and performing a plasma process in a state where a DC current is allowed to flow between the base of the lower electrode and the focus ring through the electrical connection mechanism.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENT

Figure 1:
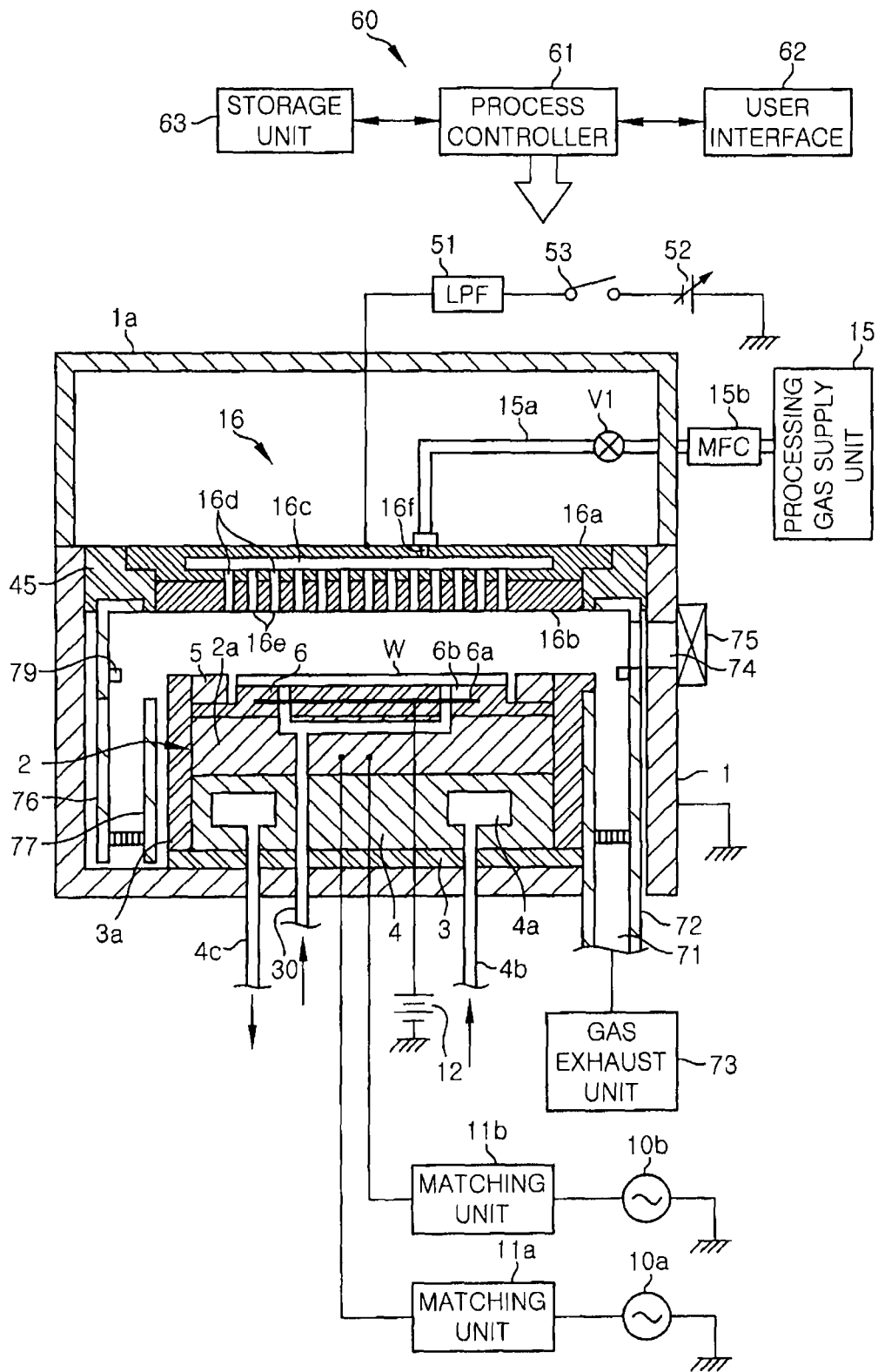
FIG. 1 shows a schematic configuration of a plasma etching apparatus in accordance with an embodiment of the present invention.

The embodiments of the present invention will be described with reference to the accompanying drawings which form a part hereof. FIG. 1 shows a configuration of a plasma etching apparatus as a plasma processing apparatus in accordance with an embodiment of the present invention.

The plasma etching apparatus includes an airtight processing chamber 1 that is electrically grounded. The processing chamber 1 is formed in a cylindrical shape and is made of, e.g., aluminum or the like. Provided in the processing chamber 1 is a mounting table 2 for horizontally supporting a semiconductor wafer W as a target substrate. The mounting table 2 has a base 2a made of metal, e.g., aluminum or the like, and serves as a lower electrode. The mounting table 2 is supported by a conductive supporting table 4 provided on the bottom of the chamber 1 via an insulating plate 3. Further, a focus ring 5 formed of, e.g., single crystalline silicon, is provided above an outer peripheral portion of the mounting table 2. Furthermore, a cylindrical inner wall member 3a made of, e.g., quartz or the like, is provided to surround the mounting table 2 and the supporting table 4.

The base 2a of the mounting table 2 is connected to a first RF (radio frequency) power supply 10a through a first matching unit 11a, and is connected to a second RF power supply 10b through a second matching unit 11b. The first RF power supply 10a is used for plasma generation, and an RF power of a predetermined frequency (about 27 MHz or higher, e.g., about 40 MHz) is supplied from the first RF power supply 10a to the base 2a of the mounting table 2. Further, the second RF power supply 10b is used for ion attraction (bias), and an RF power of a predetermined frequency (about 13.56 MHz or less, e.g., about 3.2 MHz) lower than that of the RF power from the first RF power supply 10a is supplied from the second RF power supply 10b to the base 2a of the mounting table 2. Meanwhile, a shower head 16 serving as an upper electrode is disposed above the mounting table 2 to face the mounting table 2 in parallel. The mounting table 2 and the shower head 16 serve as a pair of electrodes (upper electrode and lower electrode).

Provided on the top surface of the mounting table 2 is an electrostatic chuck 6 for electrostatically attracting and holding the semiconductor wafer W. The electrostatic chuck 6 is formed by embedding an electrode 6a in an insulator 6b, and the electrode 6a is connected to a DC power supply 12. Further, by applying a DC voltage from the DC power supply 12 to the electrode 6a, the semiconductor wafer W is attracted and held by a Coulomb force.

A coolant path 4a is formed inside the supporting table 4, and is connected to a coolant inlet line 4b and a coolant outlet line 4c. By circulating an appropriate coolant, e.g., cooling water or the like, through the coolant path 4a, the supporting table 4 and the mounting table 2 can be controlled at a predetermined temperature. Moreover, a backside gas supply line 30 for supplying a cold heat transfer gas (backside gas) to the backside of the semiconductor wafer W is provided to extend through the mounting table 2 and the like. The backside gas supply line 30 is connected to a backside gas supply source (not shown). Due to the above configuration, the semiconductor wafer W electrostatically held on the top surface of the mounting table 2 by the electrostatic chuck 6 can be controlled to a predetermined temperature.

The shower head 16 is provided at an upper portion of the processing chamber 1. The shower head 16 has a main body 16a and an upper ceiling plate 16b forming an electrode plate, and is supported at the upper portion of the processing chamber 1 via an insulation member 45. The main body 16a is made of a conductive material, e.g., aluminum having an anodically oxidized surface, and the upper ceiling plate 16b is detachably held on the bottom of the main body 16a.

A gas diffusion space 16c is provided inside the main body 16a, and a plurality of gas holes 16d are formed in the bottom of the main body 16a so as to be positioned at the bottom of the gas diffusion space 16c. In addition, gas injection holes 16e are provided in the upper ceiling plate 16b to extend through the upper ceiling plate 16b in the thickness direction thereof and communicate with the respective gas holes 16d. Due to such configuration, a processing gas supplied to the gas diffusion space 16c is supplied and diffused in the processing chamber 1 in a shower shape through the gas holes 16d and the gas injection holes 16e. Besides, the main body 16a and the like are provided with lines (not shown) for circulating a coolant, so that the shower head 16 can be cooled to a desired temperature during the plasma etching process.

Formed in the main body 16a is a gas inlet port 16f for introducing a processing gas into the gas diffusion space 16c. The gas inlet port 16f is connected to one end of a gas supply line 15a, and the other end of the gas supply line 15a is connected to a processing gas supply source 15 for supplying a processing gas for etching. The gas supply line 15a is provided with a mass flow controller (MFC) 15b and an opening/closing valve V1 disposed thereon in that order from the upstream side. Further, the processing gas for plasma etching is supplied from the processing gas supply source 15 to the gas diffusion space 16c via the gas supply line 15a, and then is supplied into the processing chamber 1 in a shower shape through the gas holes 16d and the gas injection holes 16e.

A variable DC power supply 52 is electrically connected to the shower head 16 serving as the upper electrode via a low pass filter (LPF) 51. The power supply of the variable DC power supply 52 can be on-off controlled by an on/off switch 53. A current and a voltage of the variable DC power supply 52 and an on/off operation of the on/off switch 53 are controlled by a control unit 60 to be described later. As will be described later, when a plasma is generated in a processing space by applying the RF powers from the first RF power supply 10a and the second RF power supply 10b to the mounting table 2, the on/off switch 53 is turned on by the control unit 60 if necessary, and a predetermined negative DC voltage is applied to the shower head 16 serving as the upper electrode.

A cylindrical ground conductor 1a extends upward from the sidewall of the processing chamber 1 so as to be located at a position higher than the height position of the shower head 16. The cylindrical ground conductor 1a has a ceiling wall at the top thereof.

A gas exhaust port 71 is formed at the bottom of the processing chamber 1, and a gas exhaust unit 73 is connected to the gas exhaust port 71. By operating a vacuum pump provided in the gas exhaust unit 73, the inside of the processing chamber 1 can be depressurized to a predetermined vacuum level. Meanwhile, a loading/unloading port 74 for the wafer W is provided at a sidewall of the processing chamber 1, and a gate valve 75 for opening or closing the loading/unloading port 74 is provided at the loading/unloading port 74.

Reference numerals 76 and 77 in the drawing denote deposition shields that are detachably installed. The deposition shield 76 is provided along the inner wall surface of the processing chamber 1, and prevents etching by-products (deposits) from being attached to the processing chamber 1. A conductive member (GND block) 79 DC-connected to the ground is provided to a portion of the deposition shield 76 at a height position substantially same as the height of the semiconductor wafer W. Accordingly, an abnormal discharge can be prevented.

The whole operation of the plasma etching apparatus configured as described above is controlled by a control unit 60. The control unit 60 has a process controller 61 which has a CPU and controls each unit of the plasma etching apparatus, a user interface 62 and a storage unit 63.

The user interface 62 includes a keyboard for a process manager to input commands to operate the plasma etching apparatus, a display for visualizing an operational status of the plasma etching apparatus, and the like.

The storage unit 63 stores therein recipes including a control program (software), processing condition data and the like for realizing various processes performed by the plasma etching apparatus under the control of the process controller 61. Moreover, when a command is received from the user interface 62, a necessary recipe is retrieved from the storage unit 63 and executed by the process controller 61, so that a desired process is performed by the plasma etching apparatus under the control of the process controller 61. Further, the recipes including the control program, the processing condition data and the like can be stored in a computer-readable storage medium (for example, a hard disk, a CD, a flexible disk, a semiconductor memory, or the like) or can be transmitted on-line, when needed, from another apparatus, via, e.g., a dedicated line.

Figure 2:
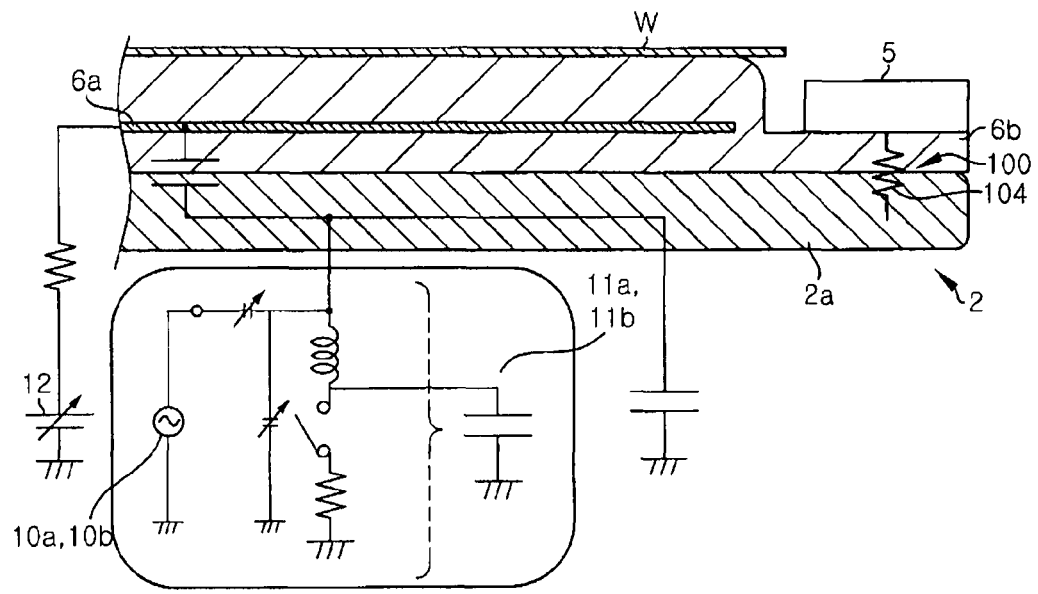
FIG. 2 schematically shows a configuration of principal parts of the plasma etching apparatus shown in FIG. 1.

FIG. 2 schematically shows a configuration of the mounting table 2 of the plasma etching apparatus configured as described above. The insulator 6b formed of a thermally sprayed film or the like is formed on the top surface of the mountain table 2 having the base 2a made of a conductive metal such as aluminum or the like. The electrostatic chuck electrode 6a is embedded in the insulator 6b. The DC power supply 12 is connected to the electrode 6a. Further, the focus ring 5 is mounted on the insulator 6b to surround the semiconductor wafer W, and is electrically connected to the base 2a of the mounting table 2 which is made of a conductive metal via an electrical connection mechanism 100 having a current control element.

Figure 3:
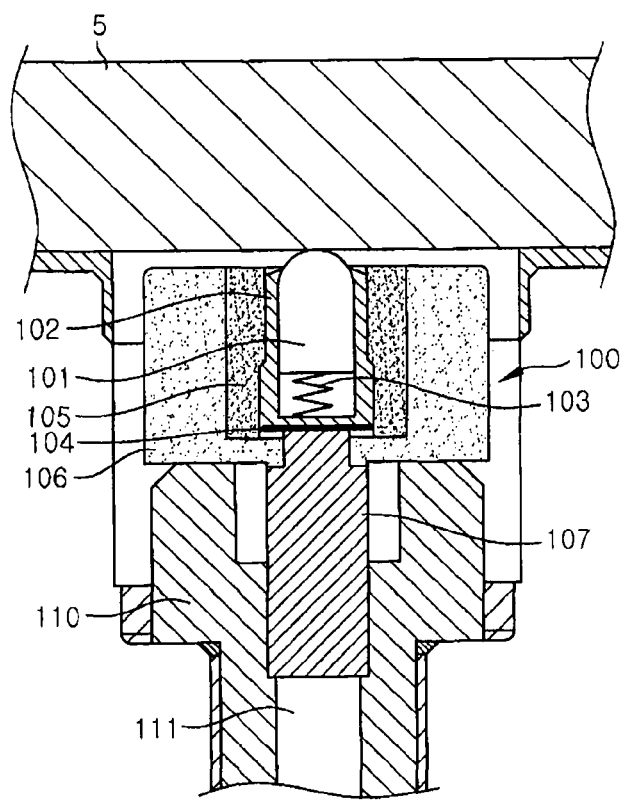
FIG. 3 schematically shows an example of an electrical connection mechanism of the plasma etching apparatus shown in FIG. 2.

As shown in FIG. 2, in the present embodiment, a resistor element (thermally sprayed film to be described later) 104 is used as the current control element of the electrical connection mechanism 100. FIG. 3 schematically shows a configuration of the electrical connection mechanism 100. The electrical connection mechanism 100 is formed of a conductive member, and has a columnar pin (contact terminal) 101 which comes in contact with the backside of the focus ring 5. The pin 101 is accommodated in a cylindrical case 102 formed of a conductive member and having a bottom such that a leading end thereof is protruded from the case 102, and is engaged in the case 102 movably in a lengthwise direction (vertical direction in FIG. 3). The pin 101 has a diameter of, e.g., about 3 mm, which is very small compared to the semiconductor wafer having a diameter of about 300 mm, or the focus ring 5 disposed around the outer periphery of the semiconductor wafer W.

Further, an elastic member 103 formed of a coil spring is provided between a rear end portion of the pin 101 and the bottom portion of the case 102. Due to the elastic member 103, the pin 101 is maintained in a state where it is biased toward the side of the leading end portion thereof. Hence, when the focus ring 5 is mounted on the pin 101, the pin 101 is retreated downward by the weight of the focus ring 5, and the leading end portion of the pin 101 comes into contact with the backside of the focus ring 5 while pressing the backside of the focus ring 5 by the biasing force of the elastic member 103. Accordingly, the electrical connection between the pin 101 and the focus ring 5 are reliably achieved.

Moreover, the resistor element serving as the current control element is formed of a thermally sprayed ceramic film formed on the rear end surface of the case 102, i.e., a thermally sprayed titanium oxide film 104 in the present embodiment. The resistor element formed of the thermally sprayed film 104 is set to have a resistance of, e.g., about 20 M$\Omega$ to 200 M$\Omega$, with respect to an entire DC current (DC) of a circuit for electrically connecting the focus ring 5 to the mounting table 2.

A cylindrical insulating member 105 is provided at an outer side of the case 102, and an outer insulating member 106 formed in a vessel shape is provided at the outer side of the cylindrical insulating member 105. In addition, a connector 107 extends through the bottom portion of the outer insulating member 106 and protrudes to the outside. The connector 107 is inserted into a hole 111 formed at a central portion of a vacuum screw 110 made of aluminum or the like, and is electrically connected to the vacuum screw 110. The structure of surrounding the pin 101 with the insulating member 105 and the outer insulating member 106 acts as a resistor to the DC current and has an impedance sufficiently high for the high frequency applied for the plasma generation. In this regard, high frequency transmitting impedances (about a few $\Omega$) of the focus ring 5 and the semiconductor wafer W are not affected.

A plurality of (e.g., 12) vacuum screws 110 spaced apart from each other at a regular interval along the circumference of the mounting table 2 is used to clamp the mounting table 2 to the supporting table 4 shown in FIG. 1. Each of the vacuum screws 110 may be provided with the electrical connection mechanism 100, or only one of the vacuum screws 110 may be provided with the electrical connection mechanism 100. Besides, an electrical connection mechanism having another configuration may be provided at a portion other than the vacuum screws 110.

As described above, the base 2a of the mounting table 2 is connected to the first RF power supply 10a via the first matching unit 11a and also connected to the second RF power supply 10b via the second matching unit 11b. FIG. 2 illustrates an equivalent circuit showing the electrical connection state. The polarization charges are generated between the electrode 6a of the electrostatic chuck 6 and the base 2a of the mounting table 2. The polarization potential is divided by the high frequency application circuit connected to the base 2a and thus is determined by the high frequency application circuit constant and the chamber circuit constant.

As described above, in the present embodiment, the focus ring 5 and the base 2a of the mounting table 2 are electrically connected to each other through the resistor element (thermally sprayed film 104) by the electrical connection mechanism 100. Hence, a DC current flows through the electrical connection mechanism 100 by the potential difference between the focus ring 5 and the base 2a of the mounting table 2.

During the plasma etching process, the focus ring 5 and the semiconductor wafer W exposed to the plasma have substantially the same potential (e.g., about −2000 V at maximum) by a self bias. Meanwhile, the base 2a of the mounting table 2 has a plus potential by the effect of a high DC voltage applied to the electrostatic chuck electrode 6a. However, in the present embodiment, the focus ring 5 and the base 2a of the mounting table 2 are electrically connected to each other via a resistor element by the electrical connection mechanism 100, so that a DC current flows through the electrical connection mechanism 100.

Due to the generation of the DC current, the potential difference between the focus ring 5 and the base 2a of the mounting table 2 can be reduced to, e.g., about 500 V. In other words, due to the generation of the DC current, the potential of the base 2a of the mounting table 2 becomes close to that of the focus ring 5. This leads to the decrease of the potential difference between the base 2a of the mounting table 2 and the semiconductor wafer W, so that it is possible to prevent discharge between the semiconductor wafer W and the base 2a of the mounting table 2 or its surrounding structure. Accordingly, the production yield is increased, and the productivity is improved. In addition, it is also possible to prevent discharge from occurring between the focus ring 5 and the base 2a of the mounting table 2 or its surrounding structure.

As described above, when the focus ring 5 and the base 2a of the mounting table 2 are electrically connected to each other directly without providing a current control element such as a resistor element therebetween, the impedance seen from the plasma is decreased more at the focus ring 5 than at the semiconductor wafer W. Hence, the plasma is formed in a doughnut-shape above the focus ring 5, which affects the plasma etching process. For that reason, when the resistor element is used as the current control element, it is preferable to electrically connect the focus ring 5 and the base 2a of the mounting table 2 via a resistor having a resistance of about 20 MΩ to 200 MΩ.

Figure 4:
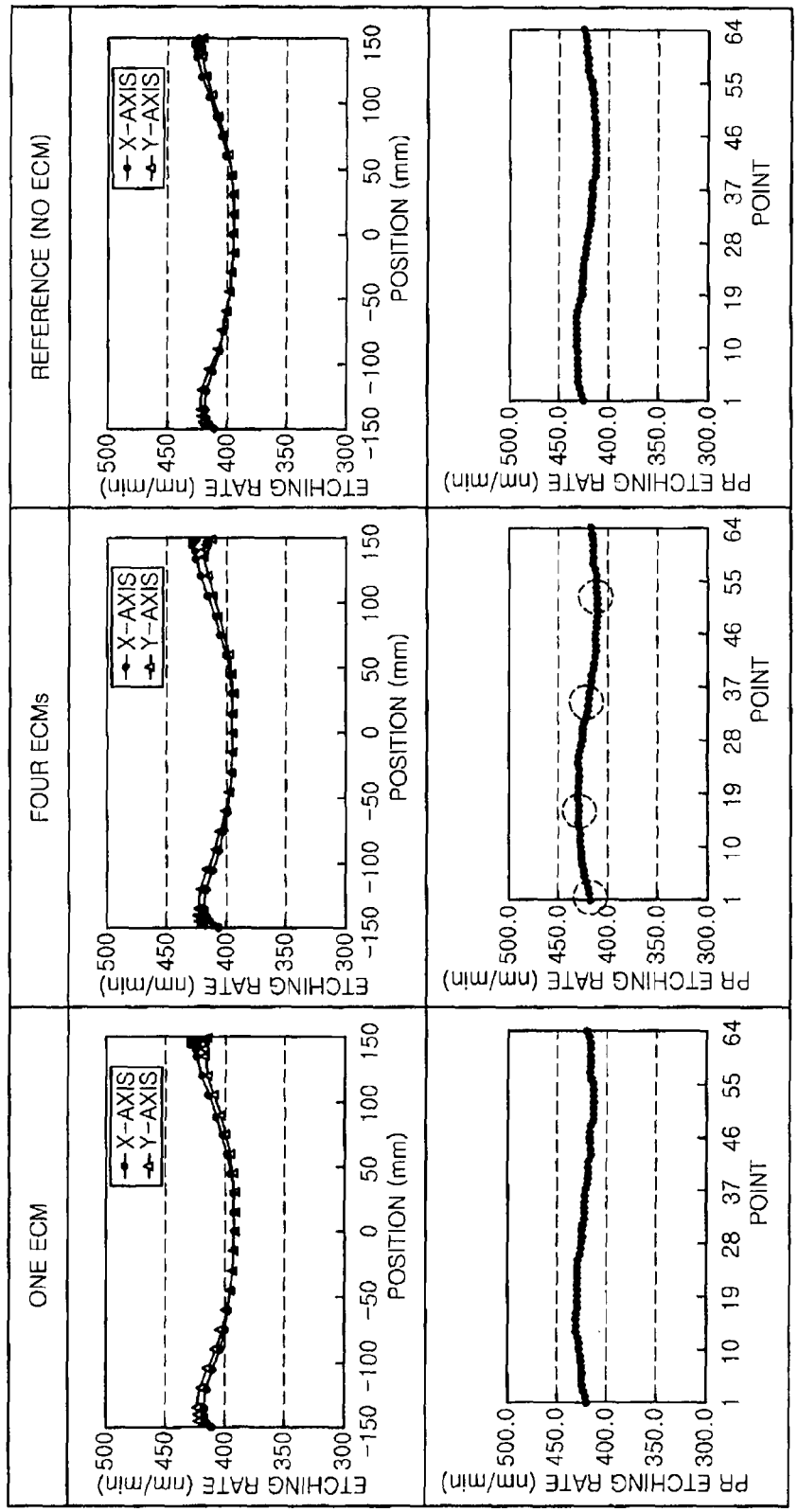
FIG. 4 depicts graphs showing results of examining effects of the electrical connection mechanism on a plasma etching process.

The graphs of FIG. 4 show the result of examining in-plane uniformity of etching rates obtained by plasma-etching a silicon oxide film in the case of providing a single electrical connection mechanism (ECM) 100 configured as described above, in the case of providing four electrical connection mechanisms 100 spaced apart from each other at regular intervals in the circumferential direction, and in the case of not providing the electrical connection mechanism 100. In FIG. 4, the upper graphs show the results of measuring the etching rates at 57 points in the X-Y direction of the semiconductor wafer W, and the lower graphs show the result of measuring the etching rates at 64 points along the circumferential direction of the semiconductor wafer W. In the lower central graph of FIG. 4, dotted circles indicate the positions where the electrical connection mechanisms 100 are provided.

As can be seen from the graphs, the etching rate and the in-plane uniformity measured in the case where the single electrical connection mechanism 100 is provided and those measured in the case where the four electrical connection mechanisms 100 spaced apart from each other at regular intervals are provided in the circumferential direction were substantially the same as those measured in the case where the electrical connection mechanism 100 is not provided. Therefore, it is clear that the variation in the plasma or the like can be avoided by providing the electrical connection mechanism 100.

Figure 5:
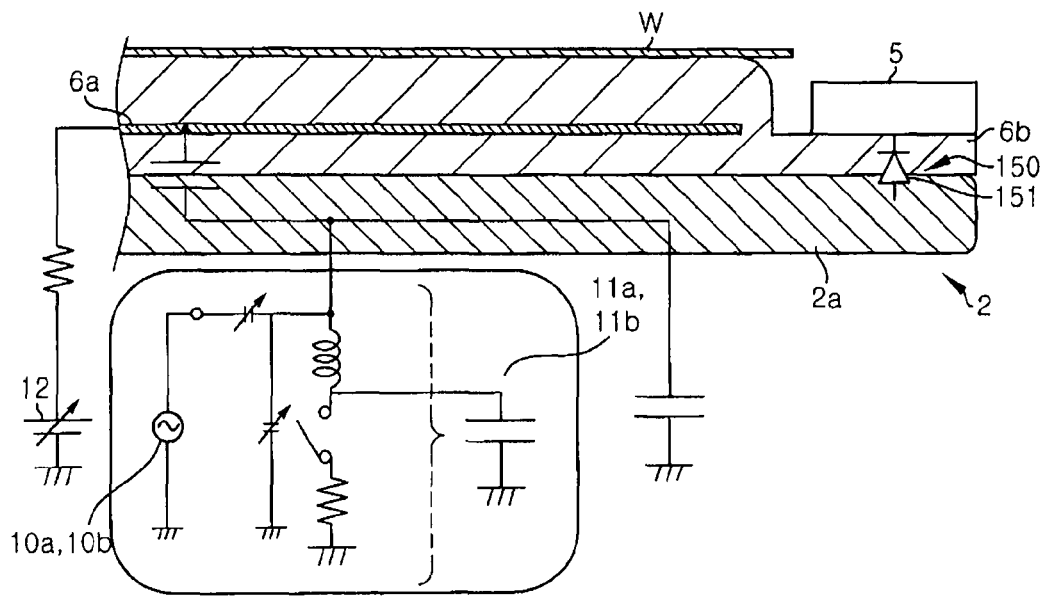
FIG. 5 schematically shows another example of the configuration of the principal parts of the plasma etching apparatus shown in FIG. 1.

FIG. 5 shows an example using an electrical connection mechanism 150 having a configuration different from that of the electrical connection mechanism 100. This electrical connection mechanism 150 uses a zener diode 151 as a current control element. In the case of using the zener diode 151, a current flows through the zener diode 151 when the potential difference between the focus ring 5 and the base 2a of the mounting table 2 is larger than a preset value. Accordingly, the potential difference between the focus ring 5 and the base 2a of the mounting table 2 can be controlled to the preset value (e.g., about 500 V). Further, even when the zener diode 151 is used, a resistor element needs to be connected in parallel to the zener diode 151 depending on the capacitance of the zener diode 151.

If the potential difference between the focus ring 5 and the base 2a of the mounting table 2 can be controlled to the preset value, it is possible to prevent discharge between the semiconductor wafer W and the base 2a of the mounting table 2 or its surrounding structure, and also possible to prevent a potential difference therebetween from affecting the state of the plasma etching process.

Figure 6:
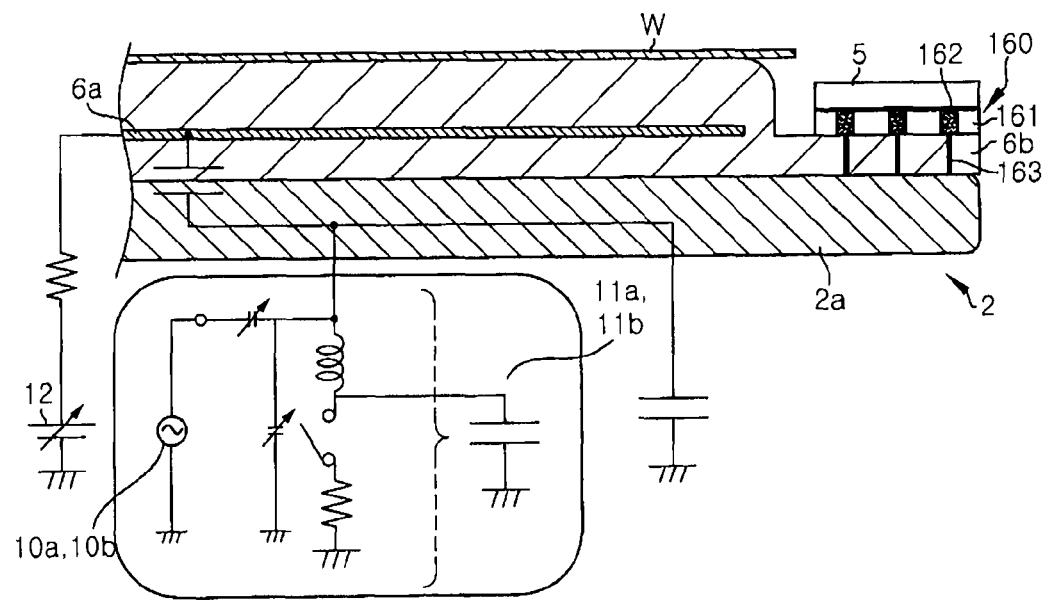
FIG. 6 schematically shows still another example of the configuration of the principal parts of the plasma etching apparatus shown in FIG. 1.

FIG. 6 shows an example using an electrical connection mechanism 160 having a configuration different from that of the electrical connection mechanism 100. In the electrical connection mechanism 160, a heat transfer sheet 161 is disposed between the focus ring 5 and the mounting table 2, and a plurality of electrical connecting portions 162 are scattered in the heat transfer sheet 161. Further, conductive members 163 are provided in the insulator 6b so as to correspond to the electrical connecting portions 162, thereby achieving electrical connection between the focus ring 5 and the base 2a of the mounting table 2.

In this case, by controlling the electrical resistance values of the respective electrical connecting portions 162, the focus ring 5 and the base 2a of the mounting table 2 can be electrically connected to each other via a constant resistor. Besides, there may be provided a configuration in which a resistor element or the like is provided at the conductive members 163 for electrically connecting the electrical connecting portions 162 and the base 2a of the mounting table 2.

Figure 7:
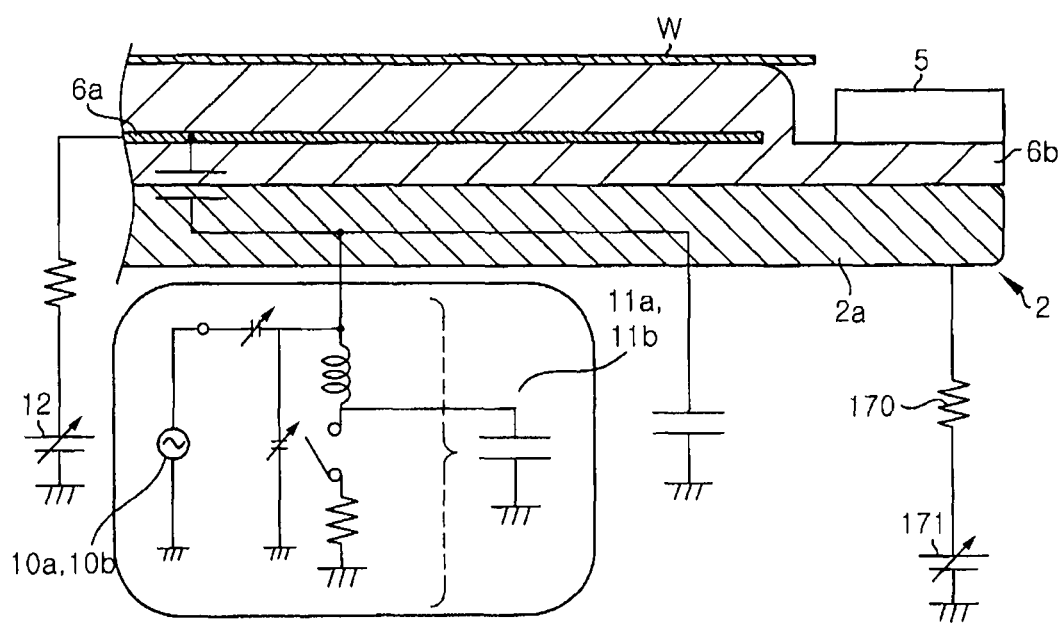
FIG. 7 schematically shows a reference example of the configuration of the principal parts of the plasma etching apparatus.

Instead of the electrical connection between the focus ring 5 and the base 2a of the mounting table 2, a DC power supply 171 may be connected to the base 2a of the mounting table 2 via a resistor element 170, as can be seen from FIG. 7. In that case, by directly controlling the potential of the base 2a of the mounting table 2, it is possible to prevent discharge between the semiconductor wafer W and the base 2a of the mounting table 2 or its surrounding structure. However, in that case, a DC power supply 171 needs to be provided additionally.

Hereinafter, there will be described a process sequence of plasma-etching a silicon oxide film and the like formed on the semiconductor wafer W, which is performed by the plasma etching apparatus configured as described above. First, the gate valve 75 is opened, and the semiconductor wafer W is loaded through the loading/unloading port 74 into the processing chamber 1 by a transfer robot (not shown) or the like from a load lock chamber (not shown), and then is mounted on the mounting table 2. Thereafter, the transfer robot is retreated from the processing chamber 1, and the gate valve 75 is closed. Then, the processing chamber 1 is evacuated by the vacuum pump of the gas exhaust unit 73 through the gas exhaust port 71.

After the inside of the processing chamber 1 reaches a predetermined vacuum level, a predetermined processing gas (etching gas) is introduced from the processing gas supply source 15 into the processing chamber 1, and the inside of the processing chamber 1 is maintained at a predetermined pressure level. In this state, a RF power of a frequency of, e.g., about 40 MHz, is supplied from the first RF power supply 10a to the base 2a of the mounting table 2. Further, a RF power of a frequency of, e.g., about 3.2 MHz, for ion attraction is supplied from the second RF power supply 10b to the mounting table 2. At this time, a predetermined DC voltage (e.g., a DC voltage of about +2500 V) is applied from the DC power supply 12 to the electrode 6a of the electrostatic chuck 6, and the semiconductor wafer W is electrostatically attracted on the electrostatic chuck 6 by a Coulomb force.

In this case, due to the application of the RF powers to the mounting table 2 serving as the lower electrode as described above, an electric field is formed between the shower head 16 serving as the upper electrode and the mounting table 2 serving as the lower electrode. A discharge is generated in a processing space in which the semiconductor wafer W exists, and the silicon oxide film and the like formed on the semiconductor wafer W are etched by the plasma of the processing gas which is generated by the discharge. As described above, in the present embodiment, it is possible to prevent discharge between the semiconductor wafer W and the base 2a of the mounting table 2 or its surrounding structure during the plasma etching.

Since a DC voltage can be applied to the shower head during the plasma process as described above, the following effects are obtained. A plasma having a high electron density and a low ion energy may be required depending on a process involved. If a DC voltage is used in that case, energy of ions implanted to the semiconductor wafer W is suppressed, and the electron density of the plasma is increased. As a consequence, an etching rate of an etching target film formed on the semiconductor wafer W is increased, and a sputtering rate of a film serving as a mask formed on the etching target film is reduced, which results in improvement of selectivity.

Upon the completion of the etching process, the supply of the high frequency powers, the supply of the DC voltage and the supply of the processing gas are stopped, and the semiconductor wafer W is unloaded from the processing chamber 1 in the reverse sequence as described above.

As described above, in accordance with the present embodiment, it is possible to prevent discharge between the semiconductor wafer and the base of the mounting table (lower electrode) or its surrounding structure, which results in an increased production yield and hence an improved productivity. Further, the present invention can be variously modified without being limited to the above embodiment.

While the invention has been shown and described with respect to the embodiments, it will be understood by those skilled in the art that various changes and modification may be made without departing from the scope of the invention as defined in the following claims.

What is claimed is:

1. A processing apparatus comprising:
   a processing chamber;
   a lower electrode provided in the processing chamber and having a base made of a conductive metal to which a high frequency power is applied, wherein the lower electrode supports a target substrate;
   an upper electrode provided in the processing chamber to face the lower electrode; and
   a focus ring disposed above the lower electrode to surround the target substrate,
   wherein an electrical connection mechanism is provided between the base of the lower electrode and the focus ring to electrically connect the base of the lower electrode to the focus ring through a current control element, and generates a DC current in accordance with a potential difference between the base of the lower electrode and the focus ring,
   wherein the current control element includes a resistor element, and
   wherein the electrical connection mechanism includes a contact terminal which comes in contact with a backside of the focus ring and an elastic member for biasing the contact terminal toward the focus ring.

2. The processing apparatus of claim 1, wherein the resistor element has a resistance of about 20 MΩ to 200 MΩ and the base of the lower electrode and the focus ring are electrically connected to each other through the resistor element.

3. The processing apparatus of claim 1, wherein the resistor element is formed of a thermally sprayed film.

4. A processing apparatus comprising:
   a processing chamber;
   a lower electrode provided in the processing chamber and having a base made of a conductive metal to which a high frequency power is applied, wherein the lower electrode supports a target substrate;
   an upper electrode provided in the processing chamber to face the lower electrode; and
   a focus ring disposed above the lower electrode to surround the target substrate,
   wherein an electrical connection mechanism is provided between the base of the lower electrode and the focus ring to electrically connect the base of the lower electrode to the focus ring through a current control element, and generates a DC current in accordance with a potential difference between the base of the lower electrode and the focus ring, and
   wherein the electrical connection mechanism includes a heat transfer sheet inserted between the backside of the focus ring and the base of the lower electrode and a plurality of conductive portions scattered in the heat transfer sheet.

5. A processing apparatus comprising:
   a processing chamber;
   a lower electrode provided in the processing chamber and having a base made of a conductive metal to which a high frequency power is applied, wherein the lower electrode supports a target substrate;
   an upper electrode provided in the processing chamber to face the lower electrode; and
   a focus ring disposed above the lower electrode to surround the target substrate,
   wherein an electrical connection mechanism is provided between the base of the lower electrode and the focus ring to electrically connect the base of the lower electrode to the focus ring through a current control element, and generates a DC current in accordance with a potential difference between the base of the lower electrode and the focus ring, and
   wherein the current control element includes a zener diode.

* * * * *

UNITED STATES PATENT AND TRADEMARK OFFICE
CERTIFICATE OF CORRECTION

PATENT NO.        : 9,021,984 B2
APPLICATION NO.   : 13/075634
DATED             : May 5, 2015
INVENTOR(S)       : Takashi Yamamoto et al.

It is certified that error appears in the above-identified patent and that said Letters Patent is hereby corrected as shown below:

On the face of the patent, item (75) Inventors:,
change 4th Inventor "Kimlhiro Higuchi, Tokyo (JP)" to --Kumihiro Higuchi, Tokyo (JP)--.

Signed and Sealed this
Nineteenth Day of April, 2016

Michelle K. Lee
*Director of the United States Patent and Trademark Office*